United States Patent
Chen et al.

(10) Patent No.: US 9,946,742 B2
(45) Date of Patent: **\*Apr. 17, 2018**

(54) PARALLEL LOAD IN A COLUMN-STORE DATABASE

(71) Applicant: International Business Machines Corporation, Armonk, NY (US)

(72) Inventors: Ying-Pong Chen, San Jose, CA (US); Christina M. Lee, San Jose, CA (US); Antti-Pekka Liedes, Espoo (FI); Sam S. Lightstone, Toronto (CA); Marko Milek, Singapore (SG); Vijayshanker Raman, Sunnyvale, CA (US); Richard S. Sidle, Mountain View, CA (US); Jussi Vuorento, Helsinki (FI); Li Zhou, Beijing (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/080,697

(22) Filed: Mar. 25, 2016

(65) Prior Publication Data
US 2016/0210318 A1    Jul. 21, 2016

Related U.S. Application Data

(63) Continuation of application No. 14/168,221, filed on Jan. 30, 2014, now Pat. No. 9,342,544.

(51) Int. Cl.
G06F 17/30 (2006.01)
H03M 7/30 (2006.01)

(52) U.S. Cl.
CPC .... *G06F 17/30315* (2013.01); *G06F 17/3033* (2013.01); *G06F 17/30339* (2013.01); *G06F 17/30501* (2013.01); *G06F 17/30584* (2013.01); *H03M 7/60* (2013.01)

(58) Field of Classification Search
CPC ........ G06F 17/30315; G06F 17/30339; G06F 17/30501; G06F 17/3033; G06F 17/30584; H03M 7/60
See application file for complete search history.

(56) References Cited

U.S. PATENT DOCUMENTS

| 5,615,362 A | 3/1997 | Jensen et al. |
| 6,847,971 B1 | 1/2005 | Balaraman et al. |
| 2011/0016157 A1 | 1/2011 | Bear et al. |

(Continued)

FOREIGN PATENT DOCUMENTS

WO    2011153239 A2    12/2011

OTHER PUBLICATIONS

Disclosed Anonymously, "Method and System for Parallelizing Batch Load Jobs Based on Data Driven Process," IP.com, IP No. IPCOM000207301D, May 25, 2011, pp. 1-7.

(Continued)

*Primary Examiner* — Jorge A Casanova
(74) *Attorney, Agent, or Firm* — Cantor Colburn LLP; Bryan Butler

(57) ABSTRACT

In one embodiment, a method includes adding, by a computer processor, two or more compressed columns to one or more pages of a database. The adding is performed in parallel by a plurality of page-formatter threads. Each page-formatter thread adds data to the database from no more than a single compressed column.

20 Claims, 3 Drawing Sheets

(56) References Cited

U.S. PATENT DOCUMENTS

| | | |
|---|---|---|
| 2012/0221528 A1 | 8/2012 | Renkes et al. |
| 2012/0311302 A1 | 12/2012 | Yang et al. |
| 2013/0166553 A1 | 6/2013 | Yoon et al. |
| 2014/0172776 A1 | 6/2014 | Liu et al. |

OTHER PUBLICATIONS

Ragde, P., et al., "The Parallel Complexity of Element Distincntess is n (LOG n) 1/2," IP.com, IP No. IPCOM000150405D, May 31, 1987, pp. 1-17.

PARALLEL LOAD IN A COLUMN-STORE DATABASE

DOMESTIC PRIORITY

This application is a continuation of U.S. patent application Ser. No. 14/168,221, filed Jan. 30, 2014, the disclosure of which is incorporated by reference herein in its entirety.

BACKGROUND

Various embodiments of this disclosure relate to database systems and, more particularly, to parallel loading of data into column-store databases.

Data loading in a database system is the task of reading input data from a data source, converting the input data into a native format of the database, applying compression techniques to the input data to reduce its size, and finally storing the compressed input data in fixed-size pages of the database. This process is performed by a database load utility program, and the objective is to load as much data as possible in the shortest amount of time. Reducing load time is critical to reducing the time-to-value of the input data.

A column-store database system is a database in which the data is clustered in pages according to column. In other words, the data is stored in column-major format, where each page of the database storage contains data of only a single column but across multiple rows of that column. This is in contrast to a row-store database, in which a page contains all the column values of one or more rows. Column-store databases are often used for complex, analytic query workloads because such queries typically must process massive amounts of data but require reading only a small subset of the columns of the referenced database tables. Column storage enables only those columns that are referenced by the query to be scanned, thus significantly reducing the time required to answer the query as compared to scanning based on rows to extract data pertaining to only a small selection of columns. A challenge with column storage, however, comes from the fact that input data is general provided in row-major format. Thus, the data loader must support efficient conversion from row storage to column storage.

SUMMARY

In one embodiment of this disclosure, a method includes adding, by a computer processor, two or more compressed columns to one or more pages of a database. The adding is performed in parallel by a plurality of page-formatter threads. Each page-formatter thread adds data to the database from no more than a single compressed column.

In another embodiment, a system includes a memory and a processor. The memory has computer readable instructions, and the processor is configured to execute the computer readable instructions. The instructions include adding two or more compressed columns to one or more pages of a database. The adding is performed in parallel by a plurality of page-formatter threads. Each page-formatter thread adds data to the database from no more than a single compressed column.

In yet another embodiment, a computer program product includes a computer readable storage medium having computer readable program code embodied thereon. The computer readable program code is executable by a processor to perform a method. The method includes adding two or more compressed columns to one or more pages of a database. The adding is performed in parallel by a plurality of page-formatter threads. Each page-formatter thread adds data to the database from no more than a single compressed column.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of this disclosure include high performance data loading systems and methods for column-store databases. The data loading system may be able to exploit the parallel and vector processing capabilities of machine hardware to reduce load times as compared to conventional data loaders.

Figure 1:
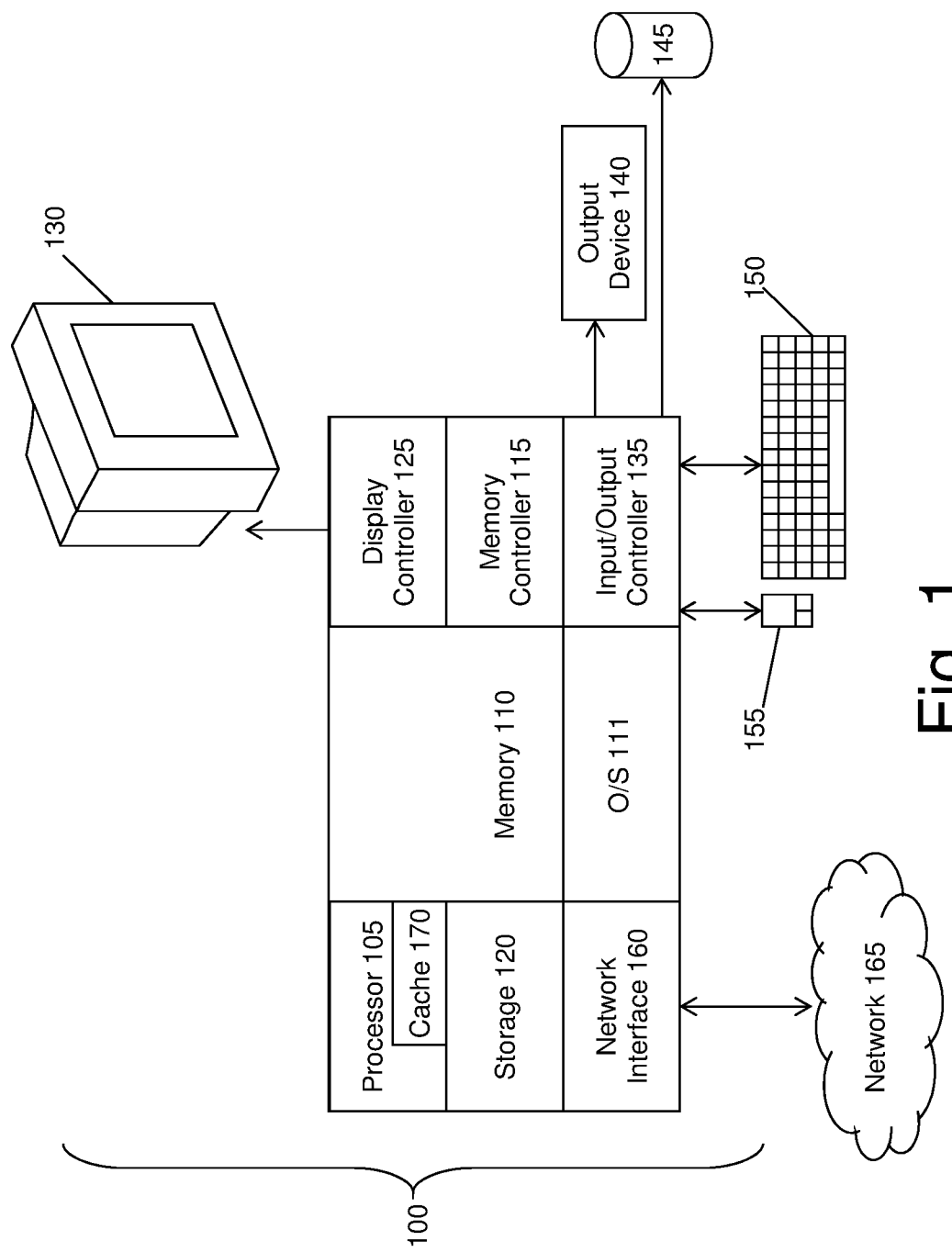
FIG. 1 is a block diagram of a computing device for implementing some or all aspects of a data-loading system, according to some embodiments of this disclosure.

FIG. 1 illustrates a block diagram of a computer system 100 for use in implementing a data-loading system or method according to some embodiments. The data-loading systems and methods described herein may be implemented in hardware, software (e.g., firmware), or a combination thereof. In an exemplary embodiment, the methods described may be implemented, at least in part, in hardware and may be part of the microprocessor of a special or general-purpose computer system 100, such as a personal computer, workstation, minicomputer, or mainframe computer.

In an exemplary embodiment, as shown in FIG. 1, the computer system 100 includes a processor 105, memory 110 coupled to a memory controller 115, and one or more input devices 145 and/or output devices 140, such as peripherals, that are communicatively coupled via a local I/O controller 135. These devices 140 and 145 may include, for example, a printer, a scanner, a microphone, and the like. A conventional keyboard 150 and mouse 155 may be coupled to the I/O controller 135. The I/O controller 135 may be, for example, one or more buses or other wired or wireless connections, as are known in the art. The I/O controller 135 may have additional elements, which are omitted for simplicity, such as controllers, buffers (caches), drivers, repeaters, and receivers, to enable communications.

The I/O devices 140, 145 may further include devices that communicate both inputs and outputs, for instance disk and tape storage, a network interface card (MC) or modulator/demodulator (for accessing other files, devices, systems, or a network), a radio frequency (RF) or other transceiver, a telephonic interface, a bridge, a router, and the like.

The processor 105, which may have one or more processing cores, is a hardware device for executing hardware instructions or software, particularly those stored in memory 110. The processor 105 may be any custom made or commercially available processor, a central processing unit (CPU), an auxiliary processor among several processors associated with the computer system 100, a semiconductor based microprocessor (in the form of a microchip or chip set), a macroprocessor, or other device for executing instructions. The processor 105 includes a cache 170, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 170 may be organized as a hierarchy of more cache levels (L1, L2, etc.).

The memory 110 may include any one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, or other types of storage media. Note that the memory 110 may have a distributed architecture, where various components are situated remote from one another but may be accessed by the processor 105.

The instructions in memory 110 may include one or more separate programs, each of which comprises an ordered listing of executable instructions for implementing logical functions. In the example of FIG. 1, the instructions in the memory 110 include a suitable operating system (OS) 111. The operating system 111 essentially may control the execution of other computer programs and provides scheduling, input-output control, file and data management, memory management, and communication control and related services.

Additional data, including, for example, instructions for the processor 105 or other retrievable information, may be stored in storage 120, which may be a storage device such as a hard disk drive or solid state drive. The stored instructions in memory 110 or in storage 120 may include those enabling the processor to execute one or more aspects of the data-loading systems and methods of this disclosure.

The computer system 100 may further include a display controller 125 coupled to a display 130. In an exemplary embodiment, the computer system 100 may further include a network interface 160 for coupling to a network 165. The network 165 may be an IP-based network for communication between the computer system 100 and any external server, client and the like via a broadband connection. The network 165 transmits and receives data between the computer system 100 and external systems. In an exemplary embodiment, the network 165 may be a managed IP network administered by a service provider. The network 165 may be implemented in a wireless fashion, e.g., using wireless protocols and technologies, such as WiFi, WiMax, etc. The network 165 may also be a packet-switched network such as a local area network, wide area network, metropolitan area network, the Internet, or other similar type of network environment. The network 165 may be a fixed wireless network, a wireless local area network (LAN), a wireless wide area network (WAN) a personal area network (PAN), a virtual private network (VPN), intranet or other suitable network system and may include equipment for receiving and transmitting signals.

Data-loading systems and methods according to this disclosure may be embodied, in whole or in part, in computer program products or in computer systems 100, such as that illustrated in FIG. 1.

Figure 2:
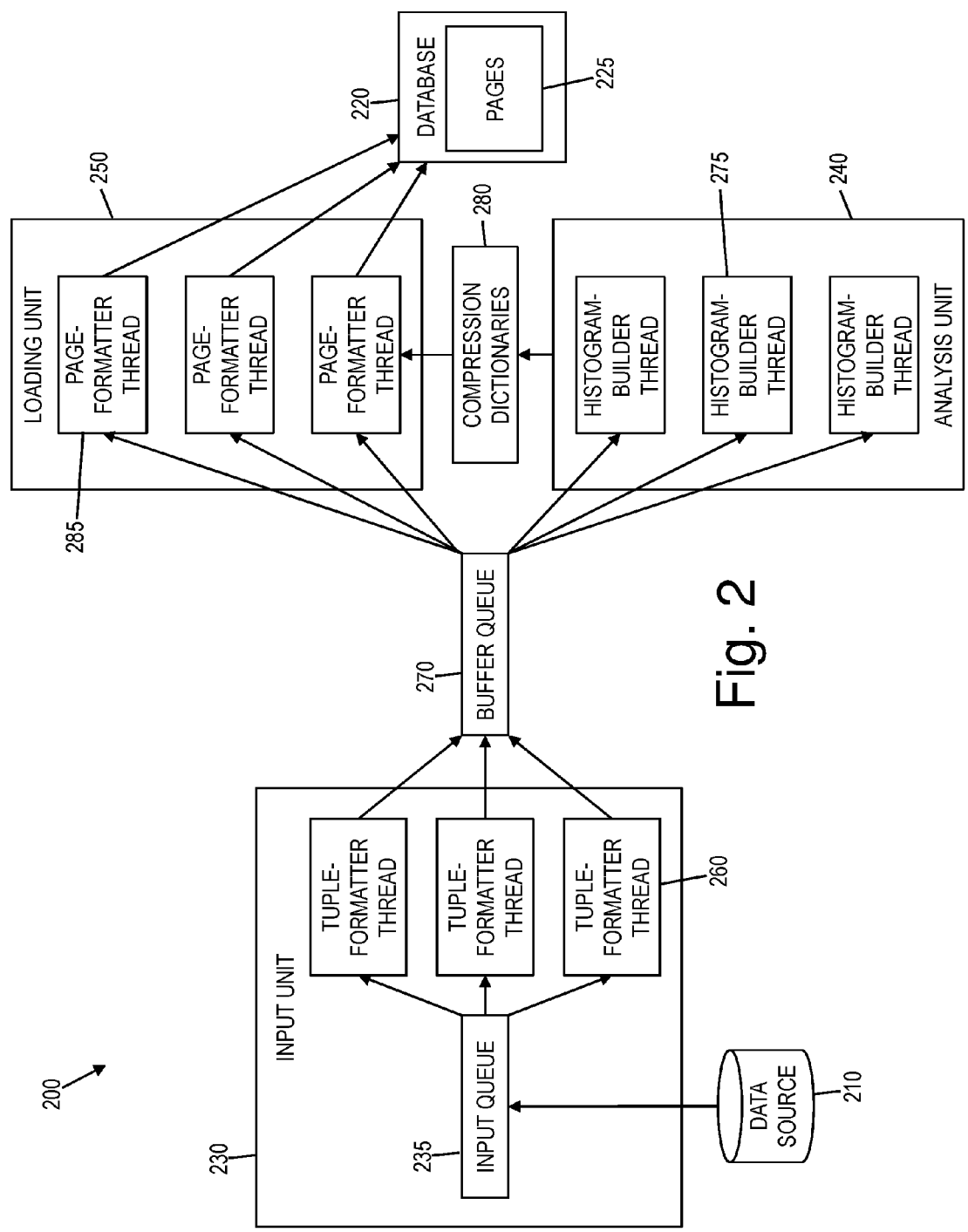
FIG. 2 is a block diagram of a data-loading system, according to some embodiments of this disclosure.

FIG. 2 is a block diagram of a data-loading system 200, according to some embodiments of this disclosure. As shown, an embodiment of the data-loading system 200 may include an input unit 230, an analysis unit 240, and a loading unit 250. Each of these units 230, 240, 250 may include hardware, software, or a combination of both. Although these units 230, 240, 250 are depicted in FIG. 2 as being distinct, this distinction is made for illustrative purposes only. The input unit 230, the analysis unit 240, and the loading unit 250 may be further divided than shown, or may include overlapping hardware, software, or both, based on the specific implementation used.

The data-loading system 200 may reduce data load time in a database system by exploiting the parallel processing capability of multi-processor machines, such as the computer system 100 of FIG. 1. In general, the data-loading system 200 may load data into a database 220 by reading input data from a data source 210, converting the input data into a native format of the database 220 (e.g., column-major format), analyzing the input data, compressing the input data, and storing the compressed input data in pages 225 of the database 220.

In some embodiments, the database 220 may be a column-store database. In some instances, multiple pages 225 containing data for a single column may be grouped together into an extent, i.e., a larger contiguous storage unit. In some other embodiments, the database 220 may be a column-group-store database, in which each page 225 contains the values of one or more columns. A column-group-store database 220 is a hybrid of a row-store and a column-store database, in which the columns of a table are partitioned into a one or more of column groups, each of which may contain one or more columns and thus a larger portion of each row.

To support compression of the input data during the loading process, the data-loading system 200 may first analyze characteristics of the input data to determine appropriate compression techniques and characteristics to use. After the analysis, the actual compression and loading may be performed using the selected compression techniques and characteristics.

Thus, input data compression may be preceded by an analysis phase, to be followed by the actual compression during a loading phase. In the analysis phase, the data-loading system 200 may process the input data to determine frequencies of the distinct values in each column. The resulting frequency information may be recorded in per-column histograms, with each histogram maintaining the frequency information for a respective column. It will be understood that such histograms need not be limited to a particular data structure; rather various data structures useable to record frequency information may be used to represent a histogram according to this disclosure. The data-loading system 200 may use the histograms to select a set of compression dictionaries 280. More specifically, for each column of the input data, a compression dictionary 280 may be created based on the histogram of frequency information for that column. Thus, a separate dictionary 280 may be created for each column to reflect the characteristics of that individual column and thereby improve storage savings versus using a single compression dictionary 280. After the analysis phase, the data-loading system 200 may perform a loading phase on the input data that was previously analyzed. In the loading phase, the input data may be read again after the analysis has been performed during a prior reading of the input data. During this reading of the input data, the input data may be compressed using the dictionaries 280 created, and then inserted into fixed-size pages 225 of the database 220, which may be arranged in column-major format.

In both the analysis phase and the loading phase, multiple threads within a hardware device may be used to increase parallelism and thereby reduce load time. In each phase, the data-loading system 200 may use a single data-reader thread, which may be part of the input unit 230, to read chunks of the input data.

Prior to the beginning of the analysis phase, the input unit 230 may convert the input data into an appropriate format for the database 220, including converting the input data into column-major format as needed. The input data may initially be located in files but may also be derived from a query or flow over a network. The input data may be in row-major format, where the stream of the input data includes all the column values for one row, followed by those for the next row, and so on. The input unit 230 may add data chunks of the input data to an input queue 235 to be processed by one or more tuple-formatter threads 260.

The tuple-formatter threads 260 may each process one chunk of the input data from the input queue 235 at a time by parsing the input data and converting each value into the data type format of the database 220. The output from each tuple-formatter thread 260 may be stored in column-major order in a corresponding tuple buffer. A tuple buffer may contain, for some batch of input rows, a column vector for each column. Thus, each tuple-formatter thread 260 may convert the input data from row-major to column-major for a chunk of input rows. The values in the column vectors of a tuple buffer may be stored in the same order across each column vector, thus retaining the original row order of the input data chunk. The tuple buffers created by the tuple-formatter threads 260 may be placed on a buffer queue 270.

In some embodiments, the various tuple formatter threads 260 may perform approximately the same amount of work on the same sized input data chunks. As a result, the work may be well-balanced across tuple-formatter threads 260 in this portion of the load processing.

As mentioned above, an analysis phase may be performed after the above conversion but prior to a loading phase. In some embodiments, the analysis phase may be performed or managed, at least in part, by the analysis unit 240 of the data-loading system 200.

In general, in the analysis phase, the data-loading system 200 may conduct a full pass through the input data. During this pass, the data-loading system 200 may track the frequencies of data values for each column in the converted input data. This tracking may be multi-threaded, with each thread processing a different column, or fraction of a column, for some horizontal portion of input data. The result of this tracking may be a single histogram for each column.

More specifically, in the analysis phase, one or more histogram-builder threads 275 may process the tuple buffers on the buffer queue 270. In a relatively simple implementation, the quantity of histogram-builder threads 275 may be no greater than the quantity of columns in the input data. In some embodiments, each histogram-builder thread 275 may process a single column vector from a single tuple buffer at a time. The histogram-builder thread 275 may add the values from its input column vector to a histogram for that column.

The analysis unit 240 may enforce a constraint that no more than one histogram-builder thread 275 may process the values of a given column at a time. Thus, each histogram-builder thread 275 may have exclusive access to its column's histogram, so synchronization mechanisms need not be required when updating the histograms.

Synchronization may be required only when a histogram-builder thread 275 completes work for one column vector and must then acquire more work from the same, or another, tuple buffer. Furthermore, a tuple buffer may contain a sufficiently large number of input data values per column to permit efficient vector processing and to amortize periodic costs of the thread's switching from one unit of work for a column to another unit of work for the same, or another, column.

Additionally, in some embodiments, the analysis unit 240 may use an efficient pattern of memory access. For instance, reading a column vector from a tuple buffer may be fully sequential. Writing to the histogram may be inherently random, but a given entry of the histogram, once read into a local memory cache, may be accessed efficiently for other occurrences within the same work unit. The likelihood of having multiple occurrences of the same value in a work unit and the resulting good cache behavior for histogram access may be increased by creating and consuming large column vectors. Further, on completing its current work unit, a histogram-builder thread 275 may be given another column vector of the same column if such a column vector is available to be processed in the next tuple buffer, such that the histogram-builder thread 275 may continue to update the same, already-cached histogram.

Limiting the quantity of histogram-builder threads 275 to the quantity of columns in the input data may not fully exploit the machine resources for narrower tables in which the quantity of columns is fewer than the quantity of processing cores on the machine. In some instances, it may be the case that the processing cost for a vector of values for one column may be significantly higher than that for another column. This can occur, for example, when one column is much wider than the others, or when there is a large difference in the number of distinct values between the different columns. In either case, the cost of updating the histograms for the column vectors of two different columns may vary widely due to varying processing costs.

To improve parallelism further in the analysis phase for such skew in the processing cost and for the narrow-table case, the analysis unit 240 may apply hash partitioning to divide the source column vectors (i.e., from the column-major version of the input data) and corresponding target column histograms into smaller chunks. For each histogram-builder thread 275, a corresponding work unit (i.e., the data being worked on at a given time) may be a hash partition of a column vector being worked on, which hash partition may then be applied to the corresponding hash partition of the column's histogram. Partitioning the overall work more finely may mean that more threads can be used, thus improving parallelism and load performance. Given K partitions for each column and C columns, up to $M=K*C$ histogram-builder threads 275 may therefore simultaneously perform work within the analysis phase, with each histogram-builder thread 275 processing a different column partition than the other histogram-builder threads. For example, by dividing up (i.e. partitioning) the work for a column that is computationally expensive to process, more histogram-builder threads 275 may work on that column, thus eliminating it as the gating factor for load performance.

When used, the above partitioning may be performed by the tuple-formatter threads 260, where the work by various tuple-formatter threads 260 may be well-balanced. For instance, after creating a tuple buffer, a tuple formatter thread 245 may divide each of its column vectors into column partition vectors by using a hash function on the column values. Because the resulting column partition vectors may be much smaller than a full column vector in a tuple buffer, the tuple-formatter thread 260 may consolidate two or more of such column partition vectors for the same column partition into a single larger vector, prior to placing that larger vector on buffer queue 270 in lieu of the column partition vectors. This consolidation may be performed to maintain sufficiently large work units for the histogram-builder threads 275, for example, to permit effective use of the memory cache and to avoid switching from one work unit to the next too frequently.

Sometimes it may be beneficial, once or periodically, to reduce memory consumption of the histograms when approaching a set memory budget for the data-loading system 200. Memory usage can be high, for example, when there are many distinct values in the input data. Memory reduction may be achieved by pruning the least frequent values from the histograms. Such pruning may be performed in a multi-threaded fashion, with each histogram-builder thread 275 pruning from the histogram of a different column.

After the converted input data is processed by the histogram-builder threads 275, the data-loading system 200 may determine one or more compression schemes for the input data. A compression scheme may be determined by an optimization process, resulting in the creation of a corresponding compression dictionary 280. Each column of the input data may be associated with its own compression dictionary 280, based on the corresponding histogram for that column. Thus, the creation of the compression dictionaries 280 may also be performed multi-threaded, where the histogram-builder threads 275 or an appropriate new set of dictionary-builder threads may produce the dictionaries 280 for the various columns, with each thread working on a single column. After the compression dictionaries 280 are completed, however, a single thread may be used to write the dictionaries 280 to storage.

In some embodiments, the analysis unit 240 may further improve load performance through the use of sampling. As input data often contains repetitions of the same data values, it may be unnecessary to process every input value to produce an effective compression dictionary 280. When the histogram-builder threads 275 are unable to consume their input as quickly as the tuple-formatter threads 260 are able to produce that input, the histogram-builder threads 275 fall behind with respect to processing data. When this occurs, the analysis unit 240 may trigger sampling of rows within the tuple-formatter threads 260 to address this imbalance and thereby improve performance. For example, if fifty-percent sampling is used, each tuple-formatter thread may add only every other row that it produces to its output tuple buffer. Alternatively, in some embodiments, instead of every other row being added to the tuple buffer, each row may have a fifty percent chance of being added, such that approximately half of the rows are included in the tuple buffer. The other half of the rows may be discarded. The imbalance is thereby addressed in that the tuple-formatter threads 260 may continue to perform approximately the same amount of work as before but the work for the histogram-builder threads 275 may be reduced based on the sampling percentage (e.g., half, in this example). It will be understood by those skilled in the art that other sampling percentages may be used, and that work performed by the histogram-builder threads 275 may be reduced accordingly based on those percentages.

The data-loading system 200 may enter the loading phase after completion of the above-described analysis phase. In some embodiments, the loading phase may be performed or managed by the loading unit 250, and the loading phase may use one or more page-formatter threads 285. In some embodiments, the quantity of page-formatter threads 285 may be fewer than or equal to the number of columns in the table that is being loaded with the input data. In such embodiments, no more than a single page-formatter thread 285 may work on a given column at a time.

A page-formatter thread 285 may work on one column vector of a tuple buffer, compress the data values in that column vector using the corresponding column compression dictionary 280 from the analysis phase, and then add the resulting compressed data to the database page 225 set to hold the column. Having a page-formatter thread 285 work on only a single column may guarantee that the data values are loaded in the same order into each column of the database 220 to retain the required row ordering. For instance, if two page-formatter threads 285 were to insert values into the same page 225 from two different tuple buffers, the resulting rows would be interleaved, violating the original ordering and resulting in different orders for different columns. Furthermore, having two page-formatter threads 285 writing to the same target page 225 would require inefficient, fine-grained synchronization that would limit parallelism.

In the loading phase, as in the analysis phase, if there are fewer columns in the table than there are processor cores, or there is sufficient skew in the amount of work required to compress and insert data values for various columns, load performance may be negatively affected. However, this may be addressed by partitioning the output of the page-formatter threads 285.

A database table may be divided into multiple partitions, referred to herein as insert ranges, each of which may contain data from all the columns of that table. For example, the data from one tuple buffer may be inserted into the columns of one insert range, while data from another tuple buffer may be inserted into the columns of a second insert range. A distinct page-formatter thread 285 may be used for each of the two insert ranges. As a result, twice as many page-formatter threads 285 may be used when two insert ranges are in a database table, as opposed to only a single insert range. A page may contain data of a single column of a single insert range. This may enable improved parallelism over conventional systems. For example, two page formatter threads 285 may process data at the same time for a column by writing into separate pages, one for each insert range. Thus, increasing the quantity of insert ranges used during the data load may multiply the degree of parallelism.

However, for each column of each insert range, there may be one partially filled extent at the end of the load. This unused space may be equal to $C*I*E$, where C is the number of columns, I is the number of insert ranges, and E is the number of bytes in an extent of pages 225. This space can become significant, especially for what would otherwise be small tables, and may be taken into consideration when determining the degree of parallelism and number of insert ranges to be used during the loading phase.

In some embodiments, the degree of parallelism may be modified through dynamic runtime adjustment. This adjustment may be based, for example, on one or more of three criteria, which may be measured during runtime on one or multiple occasions. These three criteria are as follows: (1)

The processor utilization of the page-formatter threads 285 is less than a predetermined limit, e.g., ninety percent. (2) There is enough work in the input queue to utilize further page-formatter threads 285. In other words, the data-loading system 200 is not bottlenecked by the tuple-formatter threads. (3) The data-loading system 200 has to wait for a disk write of a full page 225 less than ten percent of the time. In other words, the data-loading system 200 is not bottlenecked by the disk write.

The data-loading system 200 may measure processor utilization, the first criterion above, as the average quantity of unassigned work packets in the buffer queue 270 divided by the quantity of page-formatter threads 285. Further, a work packet may be defined as one column vector of a tuple buffer. The average quantity of unassigned work packets in a tuple buffer may be computed over the processing of various tuple buffers, for example, approximately one million, which may amount to a monitoring interval of approximately four to ten seconds.

The first and second above criteria may be checked at approximately the same time. The quantity of unassigned work packets divided by the quantity of page-formatter threads 285 may provide a ratio representing the amount of work available for a page-formatter thread 285 at a given time. If this value is less than one, the page-formatter threads 285 may have to wait for work. Increasing the parallelism may enable the data-loading system 200 to feed more work into the buffer queue 270 at a time, thus increasing this ratio and providing more work for the page-formatter threads 285, while also increasing their processor usage.

The second criterion, i.e., whether there is enough work for additional page-formatter threads 285, may be measured as the difference between unassigned work as compared to assigned or completed work during a measurement period. When a work packet enters the buffer queue 270, it is initially unassigned. When a page-formatter thread 285 retrieves the work packet from the buffer queue 270, the work packet may then be deemed assigned. When the page-formatter thread 285 finishes the work packet, that work packet may then be deemed completed. If the number of unassigned packets is fewer than the number of assigned packets or the number of completed packets, the page-formatter threads 285 may be deemed to be keeping up with the amount of work provided even if their processor utilization is limited and they have to wait. Thus, the data-loading system 200 may opt not to increase parallelism in this situation.

The third above criterion, i.e., the data-loading system 200 has to wait for a disk write of a full page 225, may be measured by how many times the data-loading system 200 has to wait for tuple buffers to return from the disk I/O writers versus the number of tuple buffers written, within a measurement period. A slow disk write may end up holding the tuple buffers too long, and if the data-loading system 200 ends up waiting, the data-loading system 200 may opt not to increase parallelism.

In some embodiments, the maximum degree of parallelism may be capped. For example, the cap may be established such that, assuming the input is compressed down to approximately twenty percent of the original data size, and each additional insert range wastes half an extent on average per column, the total waste will not exceed ten percent of the expected output size. It will be understood that other waste percentage thresholds may also be used, based on implementation. The input size may be determined from a file size of the input data, or may be measured in the analysis phase. When the file size of the input data is unknown (e.g., the input data comes from a non-file data source, such as being streamed over a network), the current database table size may be used as an estimate of the input size. Once determined, this input size may be used to establish a cap on parallelism.

The degree of sampling in the analysis phase may additionally be adjusted at runtime, based on one or both of the first two criteria considered above for modifying the degree of parallelism. The third above criteria need not play a role in determining sampling, as disk writes need not occur in the portion of the analysis phase where sampling is relevant. If one or both of the first two above criteria are met, the data-loading system 200 may decrease the sampling ratio. This may enable the histogram-builder threads 275 to run faster. Otherwise, the data-loading system 200 may opt not to decrease the sampling ration.

Figure 3:
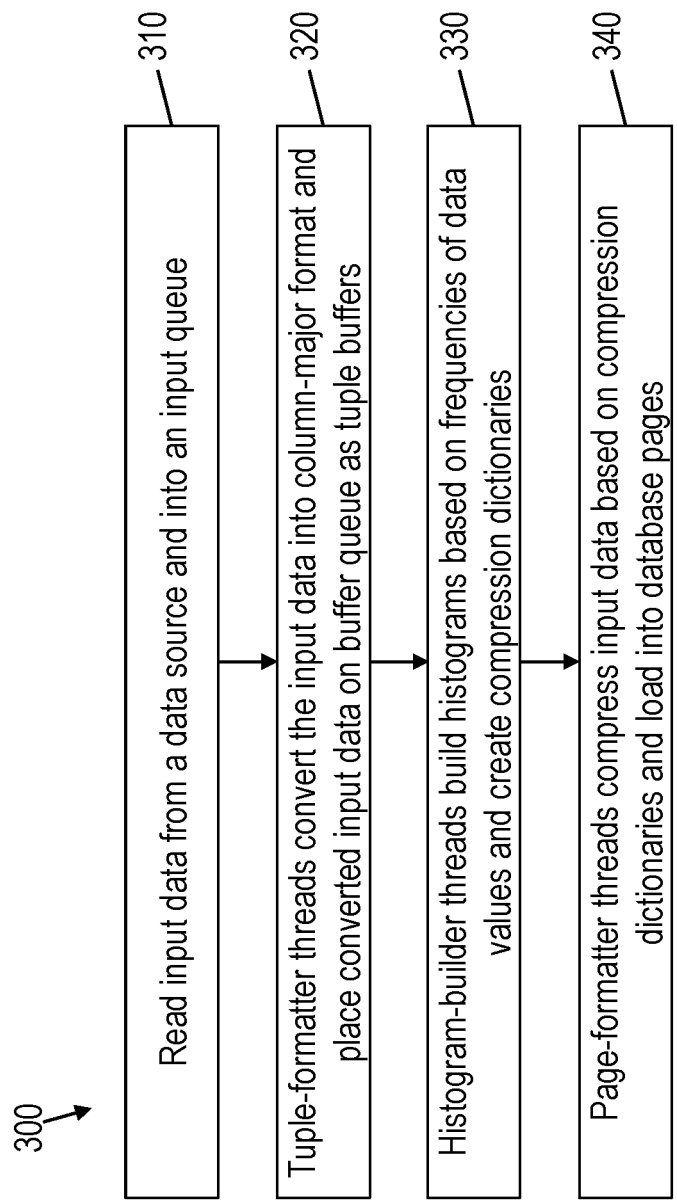
FIG. 3 is a flow diagram of a method for loading data into a column-store database, according to some embodiments of this disclosure.

FIG. 3 is a flow diagram of a method for loading data into a column-store database, according to some embodiments of this disclosure. As shown, at block 310 input data may be read in from a data source 210 into an input queue 235. At block 320, one or more tuple-formatter threads 260 may, in parallel, convert the input data into a format appropriate for a particular database 220, and may place the converted input data into a buffer queue 270. The conversion may include, for example, converting the input data into column-major format stored in a tuple buffer. At block 330, one or more histogram-builder threads 275 may, in parallel, build histograms based on the various columns of the input data, where the histogram indicate the frequencies of data values in the respective columns, and may create compression dictionaries based on those histograms. At block 340, one or more page-formatter threads 285 may, in parallel, compress the converted input data according to the compression dictionaries and load the compressed input data into one or more database pages 225. It will be understood that other methods, and modifications to this method, are also within the scope of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   reading, by a data-reader thread of a hardware device, input data in row-major format comprising values of a plurality of columns per row of a plurality of rows streamed sequentially;
   generating a plurality of histograms, comprising a respective histogram representing each column of the plurality of columns;
   granting, to each histogram-builder thread of a plurality of histogram-builder threads of the hardware device, exclusive access to a corresponding histogram of the plurality of histograms;
   compressing each column of the plurality of columns based at least in part on the respective histogram representing the column;
   adding, by the hardware device, two or more compressed columns of the plurality of columns to one or more pages of a database;
   wherein the adding is performed in parallel by a plurality of page-formatter threads of the hardware device; and
   wherein each page-formatter thread of the hardware device adds data to the database from no more than a single compressed column of the plurality of columns.

2. The method of claim 1, further comprising dynamically increasing the quantity of the page-formatter threads.

3. The method of claim 1, wherein a first table of the database comprises two or more insert ranges, the method further comprising:
   assigning a first page-formatter thread to a first insert range of the first table; and
   assigning a second page-formatter thread to a second insert range of the first table;
   wherein the first page-formatter thread and the second page-formatter thread write to the first table in parallel.

4. The method of claim 1, further comprising:
   building a plurality of sets of data value frequencies based on a plurality of columns of input data, wherein the building is performed by a plurality of builder threads, and wherein each of the plurality of builder threads is assigned to a corresponding one of the columns at a given time and is configured to build a corresponding set of data value frequencies for the corresponding column;
   creating a plurality of compression dictionaries, comprising a corresponding compression dictionary for each of the plurality of columns; and
   generating the two or more compressed columns for the database by compressing each of the columns according to the corresponding compression dictionary.

5. The method of claim 4, wherein the creating is performed by the plurality of builder threads.

6. The method of claim 4, wherein two or more builder threads process a first column of the input data, the method further comprising:
   applying a hash partitioning to divide data of the first column into two or more portions;
   applying the hash partitioning to the corresponding set of data value frequencies of the first column to divide the corresponding set of data value frequencies into two or more portions;
   assigning a first builder thread to process the first portion of the first column; and
   assigning a second builder thread to process the second portion of the first column, wherein the second builder thread is distinct from the first builder thread.

7. The method of claim 4, further comprising:
   selecting the input data from a larger set of potential input data, wherein the size of the selected input data as compared to the larger set of potential input data is based on a sampling ratio;
   wherein the sampling ratio is dynamically modifiable based on operations of the plurality of builder threads.

8. A system, comprising:
   a memory having computer readable instructions; and
   a hardware device configured to execute the computer readable instructions, the instructions comprising:
      reading, by a data-reader thread of the hardware device, input data in row-major format comprising values of a plurality of columns per row of a plurality of rows streamed sequentially;
      generating a plurality of histograms, comprising a respective histogram representing each column of the plurality of columns;
      granting, to each histogram-builder thread of a plurality of histogram-builder threads of the hardware device, exclusive access to a corresponding histogram of the plurality of histograms;
      compressing each column of the plurality of columns based at least in part on the respective histogram representing the column;
      adding two or more compressed columns of the plurality of columns to one or more pages of a database;
      wherein the adding is performed in parallel by a plurality of page-formatter threads of the hardware device; and
      wherein each page-formatter thread of the hardware device adds data to the database from no more than a single compressed column of the plurality of columns.

9. The system of claim 8, the instructions further comprising dynamically increasing the quantity of the page-formatter threads.

10. The system of claim 8, wherein a first table of the database comprises two or more insert ranges, the instructions further comprising:
    assigning a first page-formatter thread to a first insert range of the first table; and
    assigning a second page-formatter thread to a second insert range of the first table;
    wherein the first page-formatter thread and the second page-formatter thread write to the first table in parallel.

11. The system of claim 8, the instructions further comprising:
    building a plurality of sets of data value frequencies based on a plurality of columns of input data, wherein the building is performed by a plurality of builder threads, and wherein each of the plurality of builder threads is assigned to a corresponding one of the columns at a given time and is configured to build a corresponding set of data value frequencies for the corresponding column;
    creating a plurality of compression dictionaries, comprising a corresponding compression dictionary for each of the plurality of columns; and
    generating the two or more compressed columns for the database by compressing each of the columns according to the corresponding compression dictionary.

12. The system of claim 11, wherein the creating is performed by the plurality of builder threads.

13. The system of claim 11, wherein two or more builder threads process a first column of the input data, the instructions further comprising:

applying a hash partitioning to divide data of the first column into two or more portions;

applying the hash partitioning to the corresponding set of data value frequencies of the first column to divide the corresponding set of data value frequencies into two or more portions;

assigning a first builder thread to process the first portion of the first column; and assigning a second builder thread to process the second portion of the first column, wherein the second builder thread is distinct from the first builder thread.

14. The system of claim 11, the instructions further comprising:

selecting the input data from a larger set of potential input data, wherein the size of the input data as compared to the larger set of potential input data is based on a sampling ratio;

wherein the sampling ratio is dynamically modifiable based on operations of the plurality of builder threads.

15. A computer program product comprising a non-transitory computer readable storage medium having computer readable program code embodied thereon, the computer readable program code executable by a hardware device to perform a method comprising:

reading, by a data-reader thread of the hardware device, input data in row-major format comprising values of a plurality of columns per row of a plurality of rows streamed sequentially;

generating a plurality of histograms, comprising a respective histogram representing each column of the plurality of columns;

granting, to each histogram-builder thread of a plurality of histogram-builder threads of the hardware device, exclusive access to a corresponding histogram of the plurality of histograms;

compressing each column of the plurality of columns based at least in part on the respective histogram representing the column;

adding two or more compressed columns of the plurality of columns to one or more pages of a database;

wherein the adding is performed in parallel by a plurality of page-formatter threads of the hardware device; and wherein each page-formatter thread of the hardware device adds data to the database from no more than a single compressed column of the plurality of columns.

16. The computer program product of claim 15, wherein a first table of the database comprises two or more insert ranges, the method further comprising:

assigning a first page-formatter thread to a first insert range of the first table; and assigning a second page-formatter thread to a second insert range of the first table;

wherein the first page-formatter thread and the second page-formatter thread write to the first table in parallel.

17. The computer program product of claim 15, the method further comprising:

building a plurality of sets of data value frequencies based on a plurality of columns of input data, wherein the building is performed by a plurality of builder threads, and wherein each of the plurality of builder threads is assigned to a corresponding one of the columns at a given time and is configured to build a corresponding set of data value frequencies for the corresponding column;

creating a plurality of compression dictionaries, comprising a corresponding compression dictionary for each of the plurality of columns; and generating the two or more compressed columns for the database by compressing each of the columns according to the corresponding compression dictionary.

18. The computer program product of claim 17, wherein the creating is performed by the plurality of builder threads.

19. The computer program product of claim 17, wherein two or more builder threads process a first column of the input data, the method further comprising:

applying a hash partitioning to divide data of the first column into two or more portions;

applying the hash partitioning to the corresponding set of data value frequencies of the first column to divide the corresponding set of data value frequencies into two or more portions;

assigning a first builder thread to process the first portion of the first column; and assigning a second builder thread to process the second portion of the first column, wherein the second builder thread is distinct from the first builder thread.

20. The computer program product of claim 17, the method further comprising:

selecting the input data from a larger set of potential input data, wherein the size of the input data as compared to the larger set of potential input data is based on a sampling ratio;

wherein the sampling ratio is dynamically modifiable based on operations of the plurality of builder threads.

* * * * *